(12) United States Patent
Chang et al.

(10) Patent No.: US 8,459,341 B2
(45) Date of Patent: Jun. 11, 2013

(54) HEAT PIPE WITH COMPOSITE WICK STRUCTURE

(75) Inventors: Chang-Shen Chang, Taipei Hsien (TW);
Juei-Khai Liu, Taipei Hsien (TW);
Chao-Hao Wang, Taipei Hsien (TW);
Hsien-Sheng Pei, Taipei Hsien (TW)

(73) Assignee: Foxconn Technology Co., Ltd., New Taipei (TW)

( * ) Notice: Subject to any disclaimer, the term of this patent is extended or adjusted under 35 U.S.C. 154(b) by 350 days.

(21) Appl. No.: 12/940,043

(22) Filed: Nov. 4, 2010

(65) Prior Publication Data

US 2011/0048683 A1    Mar. 3, 2011

Related U.S. Application Data

(62) Division of application No. 11/959,291, filed on Dec. 18, 2007, now Pat. No. 7,845,394.

(51) Int. Cl.
*F28D 15/00* (2006.01)
*H05K 7/20* (2006.01)

(52) U.S. Cl.
USPC ............................... 165/104.26; 165/104.21

(58) Field of Classification Search
CPC ................... F28D 15/04; F28D 15/046
USPC ....... 165/104.21, 104.26; 361/700; 257/715; 174/15.2

See application file for complete search history.

(56) References Cited

U.S. PATENT DOCUMENTS

| | | | | |
|---|---|---|---|---|
| 3,700,028 A * | 10/1972 | Noren | ........... | 165/272 |
| 3,844,342 A * | 10/1974 | Eninger et al. | ........... | 165/104.26 |
| 3,901,311 A * | 8/1975 | Kosson et al. | ........... | 165/104.26 |
| 4,003,427 A * | 1/1977 | Leinoff et al. | ........... | 165/104.26 |
| 4,058,159 A * | 11/1977 | Iriarte | ........... | 165/104.26 |
| 4,116,266 A * | 9/1978 | Sawata et al. | ........... | 165/104.26 |
| 4,917,177 A * | 4/1990 | Gernert | ........... | 165/104.26 |
| 5,046,553 A * | 9/1991 | Lindner | ........... | 165/104.26 |
| 2005/0092467 A1 * | 5/2005 | Lin et al. | ........... | 165/104.26 |
| 2006/0086482 A1 * | 4/2006 | Thayer et al. | ........... | 165/104.26 |

* cited by examiner

*Primary Examiner* — Tho V Duong
(74) *Attorney, Agent, or Firm* — Altis Law Group, Inc.

(57) ABSTRACT

An exemplary heat pipe includes an elongated casing, a wick, an artery mesh, and working medium filled in the casing. The casing includes an evaporating section and a condensing section. The wick is disposed within an inner wall of the evaporating section of the casing. The artery mesh includes a large portion, and a small portion with an outer diameter smaller than that of the large portion. The small portion is located within and in direct physical contact with an inner surface of the wick. The large portion is in direct physical contact with an inner wall of the condensing section of the casing. The working medium saturates the wick and the artery mesh.

8 Claims, 8 Drawing Sheets

HEAT PIPE WITH COMPOSITE WICK STRUCTURE

CROSS-REFERENCE TO RELATED APPLICATION

This patent application is a divisional application of patent application Ser. No. 11/959,291, filed on Dec. 18, 2007, entitled "HEAT PIPE WITH COMPOSITE WICK STRUCTURE," and assigned to the same assignee as this patent application. The disclosure of patent application Ser. No. 11/959,291 is incorporated herein by reference in its entirety.

BACKGROUND

1. Technical Field

The disclosure relates generally to a heat transfer apparatus, and more particularly to a heat pipe having a composite capillary wick structure.

2. Description of Related Art

Heat pipes have excellent heat transfer performance due to their low thermal resistance, and are therefore an effective means for transfer or dissipation of heat from heat sources. Currently, heat pipes are widely used for removing heat from heat-generating components such as central processing units (CPUs) of computers.

A heat pipe is usually a vacuum casing containing a working medium therein. The working medium is employed to carry, under phase transitions between liquid state and vapor state, thermal energy from an evaporator section to a condenser section of the heat pipe. Preferably, a wick structure is provided inside the heat pipe, lining an inner wall of the casing, for drawing the working medium back to the evaporator section after it is condensed at the condenser section. In operation, the evaporator section of the heat pipe is maintained in thermal contact with a heat-generating component. The working medium contained at the evaporator section absorbs heat generated by the heat-generating component and then turns into vapor and moves towards the condenser section where the vapor is condensed into condensate after releasing the heat into the ambient environment. Due to the difference in capillary pressure which develops in the wick structure between the two sections, the condensate is then brought back by the wick structure to the evaporator section where it is again available for evaporation.

In order to draw the condensate back timely, the wick structure provided in the heat pipe is expected to provide a high capillary force and meanwhile generate a low flow resistance for the condensate. In ordinary use, the heat pipe needs to be flattened to enable the miniaturization of electronic products incorporating the heat pipe. The flattening may result in damage to the wick structure of the heat pipe. When this happens, the flow resistance of the wick structure is increased and the capillary force provided by the wick structure is decreased, which in turn reduces the heat transfer capability of the heat pipe. If the condensate is not quickly brought back from the condenser section, the heat pipe will suffer a dry-out problem at the evaporator section.

Therefore, it is desirable to provide a heat pipe with improved heat transfer capability; wherein a wick structure of the heat pipe will not be damaged and still can have a satisfactory wicking force when the heat pipe is flattened.

BRIEF DESCRIPTION OF THE DRAWINGS

Many aspects of the present heat pipe can be better understood with reference to the following drawings. The components in the drawings are not necessarily drawn to scale, the emphasis instead being placed upon clearly illustrating the principles of the present heat pipe. Moreover, in the drawings, like reference numerals designate corresponding parts throughout the several views.

DETAILED DESCRIPTION

Figure 1:
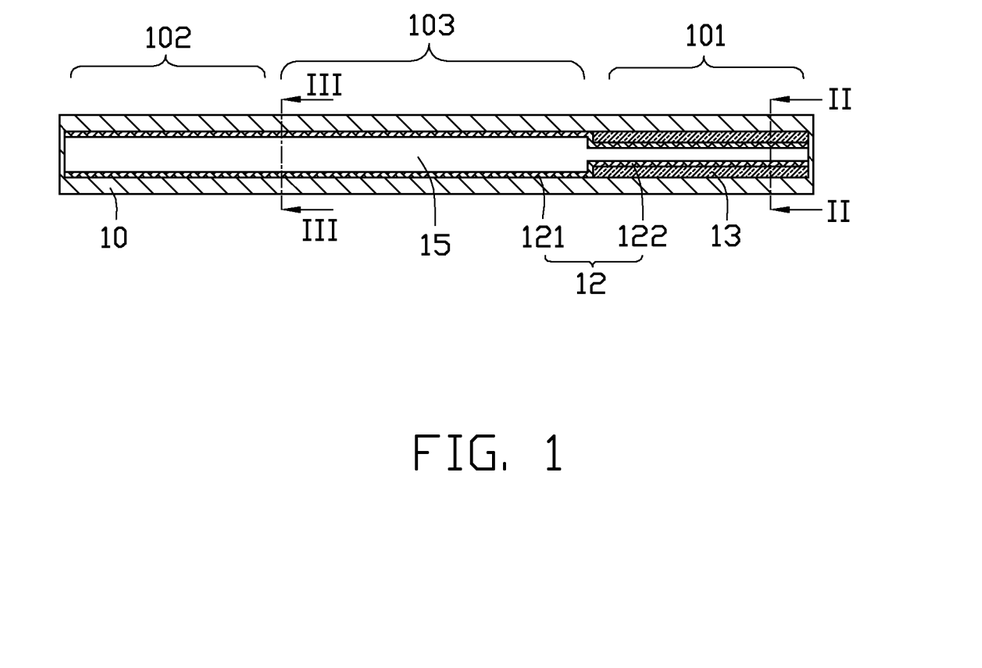
FIG. 1 is a longitudinal cross-sectional view of a heat pipe in accordance with a first embodiment of the present disclosure.
Figure 2:
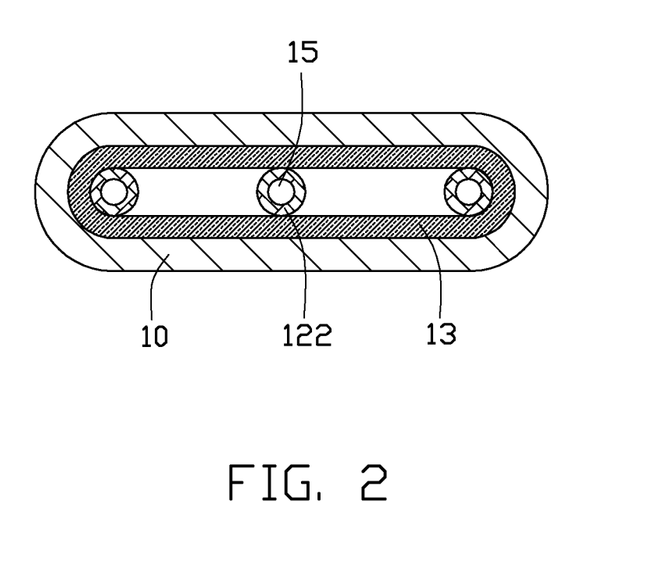
FIG. 2 is a transverse cross-sectional view of an evaporating section of the heat pipe of FIG. 1 taken along line II-II.
Figure 3:
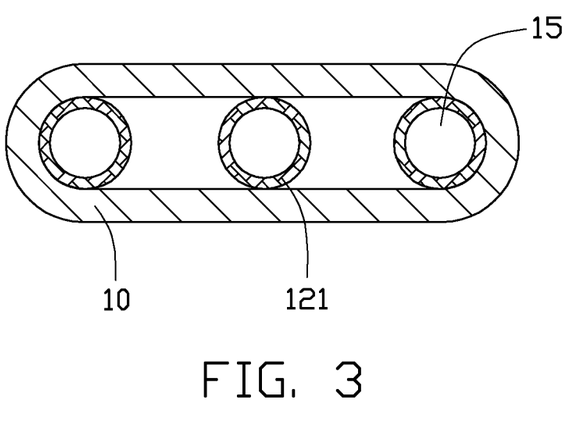
FIG. 3 is a transverse cross-sectional view of a condensing section of the heat pipe of FIG. 1 taken along line III-III.

FIGS. 1-3 illustrate a heat pipe in accordance with a first embodiment of the present disclosure. The heat pipe is a plate-type heat pipe, and includes a flat tube-like metal casing 10 with two ends thereof being sealed, and a variety of elements enclosed in the metal casing 10, i.e., a wick 13, three artery meshes 12, and a working medium (not shown).

The casing 10 is made of high thermally conductive material such as copper or aluminum. A width of the casing 10 is larger than a height of the casing 10. To accommodate light-weight requirements of electronic products, the height of the casing 10 is preferably not larger than 2 mm. The casing 10 has an evaporating section 101, an opposing condensing section 102 along a longitudinal direction of the heat pipe, and an adiabatic section 103 disposed between the evaporating section 101 and the condensing section 102. The working medium is saturated in the wick 13 and the artery meshes 12. The working medium is usually selected from a liquid, such as water, methanol, or alcohol, which has a low boiling point. The casing 10 of the heat pipe is evacuated and hermetically sealed after the working medium is injected into the casing 10 and saturated in the wick 13 and the artery meshes 12. Thus, the working medium can easily evaporate to vapor when it receives heat at the evaporating section 101 of the heat pipe.

The wick 13 is provided around an inner wall of the evaporating section 101 of the casing 10. The wick 13 is elliptic-shaped in profile, and usually selected from a porous structure such as grooves, sintered powder, screen mesh, bundles of fiber, or carbon nanotubes, which enable the wick 13 to provide a capillary force to drive condensed working medium at the condensing section 102 of the heat pipe to flow towards the evaporating section 101 thereof. In this embodiment, the wick 13 is screen mesh, for the thickness and pore size of the screen mesh can be easily changed. The thickness of the wick 13 is preferably smaller than 0.1 mm.

Figure 4:
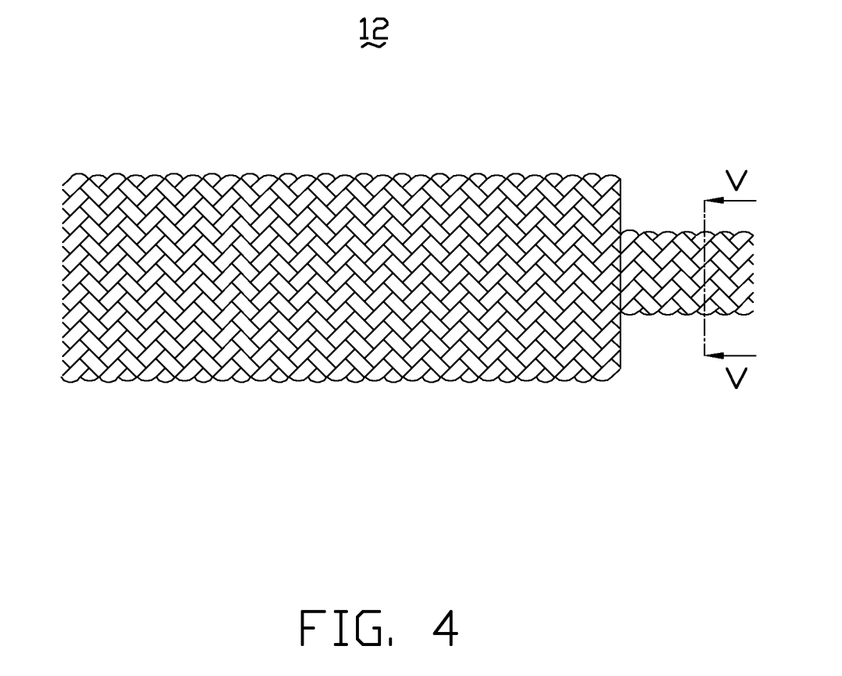
FIG. 4 is an enlarged, front view of an artery mesh of the heat pipe of FIG. 1.
Figure 5:
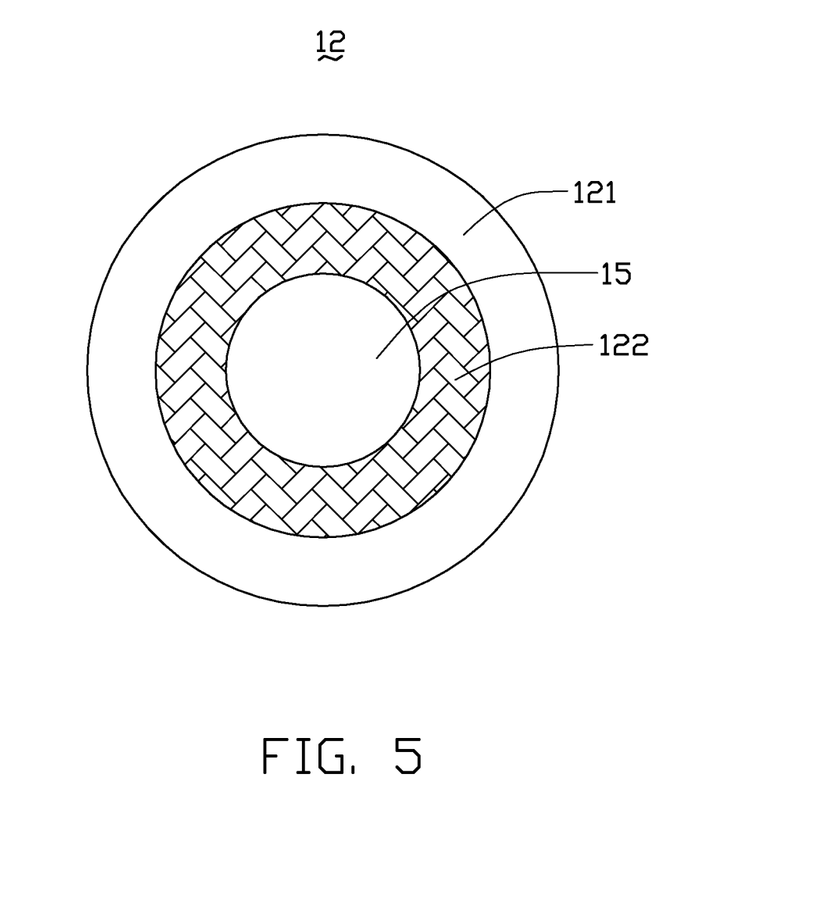
FIG. 5 is a transverse cross-sectional view of the artery mesh of FIG. 4 taken along line V-V.

Referring to FIGS. 4-5, the artery meshes 12 are formed by weaving a plurality of metal wires, such as copper or stainless steel wires, and thus have a plurality of pores formed thereon. Each artery mesh 12 is an elongated and step-shaped hollow tube, and extends along the longitudinal direction of the metal casing 10 from the evaporating section 101 to the condensing section 102. A channel 15 is defined in each artery mesh 12 with a diameter ranging from about 0.5 mm to about 2 mm.

Each artery mesh 12 includes a large portion 121 and a small portion 122. A length of the small portion 122 is approximately the same as that of the wick 13, and a length of the large portion 121 is approximately the same as a length of a sum of the adiabatic section 103 and the condensing section 102. A thickness of the large portion 121 is the same as that of the small portion 122. An inner diameter of the large portion 121 is larger than that of the small portion 122, and thus each artery mesh 12 forms a step-shaped inner surface. An outer diameter of the large portion 121 is larger than that of the small portion 122, and thus each artery mesh 12 forms a step-shaped outer surface. The outer diameter of the large portion 121 is approximately the same as an inner diameter of the casing 10, and the outer diameter of the small portion 122 is approximately the same as an inner diameter of the wick 13.

When assembled, the three artery meshes 12 are disposed into the casing 10 in parallel, and are evenly spaced from each other. The large portions 121 are linearly attached to the top and bottom sides of the inner wall of the adiabatic section 103 and the condensing section 102 of the casing 10 along an entire length of the adiabatic section 103 and the condensing section 102, and the small portions 122 are linearly attached to the top and bottom sides of the inner surface of the wick 13 along an entire length of the evaporating section 101. A composite wick structure is thus formed in the casing 10 of the heat pipe. The diameter of the channel 15 of the artery mesh 12 is very small so that the condensate in the condensing section 102 can enter the channel 15, and the vapor in the evaporating section 101 cannot enter the channel 15. Thus the inner space of the casing 10 between the artery meshes 12 provides a passage just for the vapor flowing from the evaporating section 101 to the condensing section 102, and the channels 15 of the artery meshes 12 provide a passage just for the condensate flowing back from the condensing section 102 to the evaporating section 101. On the other hand, as the wick 13 and the artery meshes 12 each have a plurality of pores communicating with each other, the two components 13, 12 can provide a capillary action to the working medium.

In operation, the evaporating section 101 of the heat pipe is placed in thermal contact with a heat source (not shown), for example, a central processing unit (CPU) of a computer, that needs to be cooled. The working medium contained in the evaporating section 101 of the heat pipe is vaporized into vapor upon receiving the heat generated by the heat source. Then, the generated vapor moves via the inner space between the artery meshes 12. After the vapor releases the heat carried thereby and is condensed into condensate in the condensing section 102, the condensate flows through the pores and the channels 15 of the artery meshes 12 to the evaporating section 101 of the heat pipe to again be available for evaporation. Meanwhile, the condensate is capable of entering the wick 13 easily due to the pores thereof which communicate with the pores of the artery meshes 12 and can provide capillary action. As a result, the condensate is drawn back to the evaporating section 101 rapidly and timely, thus preventing a potential dry-out problem occurring at the evaporating section 101 of the heat pipe. In addition, the artery meshes 12 are step-shaped, and the small portions 122 of the artery meshes 12 and the wick 13 form the composite wick structure at the evaporating section 101 of the heat pipe. The composite wick structure has different pore sizes to provide relatively large capillary force, and provide relatively low flow resistance and heat resistance at the same time. The heat transfer capability of the heat pipe is thus increased. The artery meshes 12 are distributed along the longitudinal direction of the heat pipe and linearly contact the heat pipe. As a result, the artery meshes 12 cannot easily be damaged by the process of flattening the heat pipe.

Figure 6:
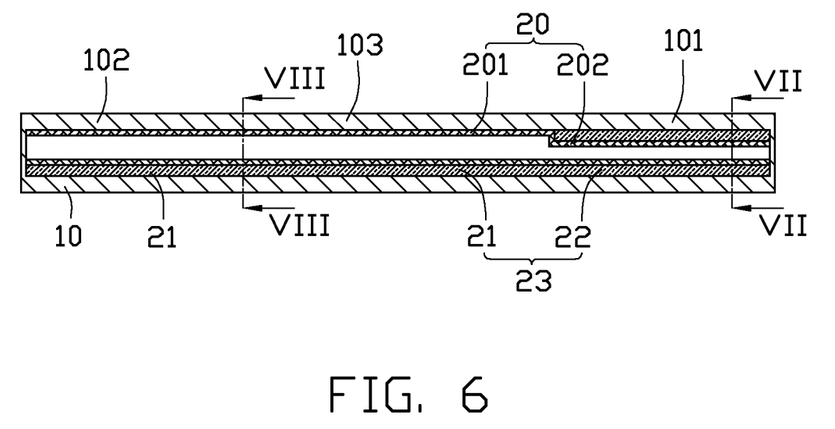
FIG. 6 is similar to FIG. 1, but shows a heat pipe according to a second embodiment of present disclosure.
Figure 7:
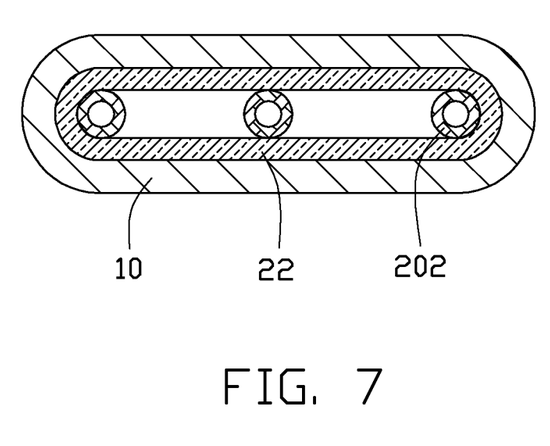
FIG. 7 is a transverse cross-sectional view of an evaporating section of the heat pipe of FIG. 6 taken along line VII-VII.
Figure 8:
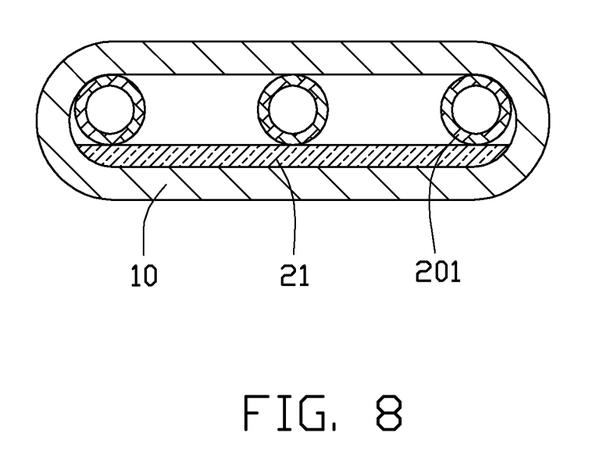
FIG. 8 is a transverse cross-sectional view of a condensing section of the heat pipe of FIG. 6 taken along line VIII-VIII.

FIGS. 6-8 schematically show a heat pipe in accordance with an alternative embodiment of the present disclosure. The casing 10 of the heat pipe of this embodiment is the same as the first embodiment. In this embodiment, the wick 23 includes a elliptic-shaped first portion 22 arranged at the evaporating section 101 of the metal casing 10 of the heat pipe, and a planar-shaped second portion 21 arranged at the bottom side of the condensing section 102 and the adiabatic section 103 of the metal casing 10. The artery meshes 20 are disposed in the casing 10 in parallel. Each artery mesh 20 includes a small portion 202 located within and contacting the first portion 22 of the wick 23, and a large portion 201 extending from the small portion 202 to the condensing section 102 of the heat pipe. The large portion 201 and the small portion 202 are each cylindrical shaped. An axis of the small portion 202 is offset from that of the large portion 201. The small portion 202 of the artery mesh 20 linearly contacts the top and bottom sides of the first portion 22 of the wick 23. A top of the large portion 201 of the artery mesh 20 linearly contacts the inner wall of the condensing and adiabatic sections 102, 103 of the heat pipe, whilst a bottom of the large portion 201 of the artery mesh 20 linearly contacts the second portion 21 of the wick 23.

As the wick 23 extends to the condensing section 102 of the heat pipe, not only the evaporating section 101 of the heat pipe forms a composite wick structure with different pore sizes, but also a composite wick structure is formed at the condensing section 102 of the heat pipe. The pore size of the first portion 22 of the wick 23 can be larger than that of the second portion 21 of the wick 23. According to the general rule, the capillary pressure of the wick structure and its flow resistance to the condensed fluid increase due to a decrease in pore size of the wick structure. Thus the first portion 22 of the wick 23 corresponding to the evaporating section 101 of the heat pipe is capable of providing a capillary pressure gradually increasing from the condensing section 102 toward the evaporating section 101, and a flow resistance gradually decreasing from the evaporating section 101 toward the condensing section 102. It is to be understood that portions of the wick 23 arranged at the evaporating section 101 and the condensing section 102 can be different from each other; for example, the first portion 22 of the wick 23 is a sintered powder wick, whilst the second portion 21 of the wick 23 is a groove wick.

Although, as shown in the above embodiments, there are three artery meshes 12, 20 disposed in the casing 10 and evenly spaced from each other, it is to be understood that the artery meshes 12, 20 can be tidily attached to each other to thus increase the number of artery meshes 12, 20 of the heat pipe, and further the number of artery meshes 12, 20 can be changed according to the size of the heat pipe. A configuration of the artery meshes 12, 20 can also be changed. For example, the artery meshes 12, 20 can have a shape similar to that of the casing 10 of the heat pipe, and thus the artery meshes 12, 20 can each have a surface contacting the casing 10 or the wick 13, 23.

It is to be understood, however, that even though numerous characteristics and advantages of the present invention have been set forth in the foregoing description, together with details of the structures and functions of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat pipe, comprising:
an elongated casing having an evaporating section and a condensing section;
a wick disposed within an inner wall of the evaporating section of the casing;
at least one artery mesh disposed in the casing, the at least one artery mesh comprising a large portion and a small portion with an outer diameter smaller than that of the large portion, the small portion being located within and in direct physical contact with an inner surface of the wick, the large portion being in direct physical contact with an inner wall of the condensing section of the casing; and
working medium filled in the casing and saturating the wick and the at least one artery mesh;
wherein the heat pipe is a flat-type heat pipe, the casing comprises two opposite flat plates and two opposite sidewalls respectively connected between opposite lateral edges of the two flat plates, and the outer diameter of the large portion of the at least one artery mesh is substantially equal to a distance between the flat plates and is less than a distance between the sidewalls; and
wherein the large portion of the at least one artery mesh is in linear and direct physical contact with each of the flat plates along an entire length of the condensing section, and the small portion of the at least one artery mesh is in linear and direct physical contact with the wick along an entire length of the evaporating section.

2. The heat pipe of claim 1, wherein the outer diameter of the small portion of the at least one artery mesh is approximately the same as an inner diameter of the wick, and the outer diameter of the large portion of the at least one artery mesh is approximately the same as an inner diameter of the condensing section of the casing.

3. The heat pipe of claim 1, wherein the at least one artery mesh comprises a plurality of artery meshes disposed in the casing of the heat pipe and contacting each other.

4. The heat pipe of claim 1, wherein the at least one artery mesh comprises a plurality of artery meshes disposed in the casing of the heat pipe and spaced from each other.

5. The heat pipe of claim 1, wherein a thickness of the heat pipe is not larger than 2 mm, and a thickness of the wick is not larger than 0.1 mm.

6. The heat pipe of claim 1, wherein the at least one artery mesh is a hollow tube with an inner diameter ranging from 0.5 mm to 2 mm, the at least one artery mesh being one of woven copper wires and woven stainless steel wires.

7. A heat pipe, comprising:
a flat tube-like metal casing having an evaporating section and a condensing section, a width of an interior of the casing being larger than a height of the interior of the casing;
a wick disposed within an inner wall of the evaporating section of the casing;
an artery mesh disposed in the casing, the artery mesh comprising a large portion in linear and direct physical contact with an inner wall of the casing along an entire length of condensing section and a small portion located within and in direct physical contact with the wick; and
working medium filled in the casing and saturating the wick and the artery mesh, an outer diameter of the large portion of the artery mesh being approximately the same as the height of the interior of the casing, the large portion of the artery mesh being in linear contact with opposite sides of the condensing section of the casing.

8. A heat pipe comprising:
a metal casing comprising an evaporating section and a condensing section;
a wick structure disposed within and contacting the evaporating section;
a hollow, interwoven artery mesh comprising a first mesh portion arranged within the evaporating section and a second mesh portion extending from the first mesh portion to the condensing section, the first mesh portion located within and being in direct physical contact with the wick structure, the second mesh portion being in direct physical contact with the condensing section, and the first mesh portion having a diameter smaller than that of the second mesh portion; and
working medium received in the casing;
wherein the casing is flat and comprises two opposite flat plates, an outer diameter of the second mesh portion of the artery mesh is substantially equal to a distance between the flat plates, and the second mesh portion of the artery mesh is in linear and direct physical contact with each of the flat plates along an entire length of the condensing section.

* * * * *